United States Patent [19]

Finger

[11] 4,186,339
[45] Jan. 29, 1980

[54] METHOD AND APPARATUS FOR MEASURING CURRENT, ESPECIALLY USEFUL IN MULTI-AMPERE SYSTEMS

[75] Inventor: Eugene P. Finger, Brewster, N.Y.

[73] Assignee: Curtis Instruments, Inc., Mount Kisco, N.Y.

[21] Appl. No.: 871,095

[22] Filed: Jan. 20, 1978

[51] Int. Cl.² .......................................... G01R 21/06
[52] U.S. Cl. ................................. 324/142; 324/126
[58] Field of Search .................... 324/142, 126, 127

[56] References Cited

U.S. PATENT DOCUMENTS

| 720,335 | 2/1903 | Eastman | 324/126 X |
|---|---|---|---|
| 1,446,995 | 2/1923 | Sines | 324/126 UX |
| 1,590,970 | 6/1926 | Fritz | 324/127 |
| 2,362,372 | 11/1944 | Halfmann | 324/127 X |
| 2,724,821 | 11/1955 | Schweitzer, Jr. | 324/127 X |
| 3,197,702 | 7/1965 | Schweitzer, Jr. | 324/127 |
| 3,428,896 | 2/1969 | Schweitzer, Jr. | 324/127 X |
| 3,460,042 | 8/1969 | Harner | 324/127 UX |

*Primary Examiner*—Stanley T. Krawczewicz
*Attorney, Agent, or Firm*—Pennie & Edmonds

[57] ABSTRACT

The disclosed method and apparatus make three connections to a pair of conductors: two at spaced-apart points on one conductor and the third on the other conductor. Using the power available in the conductors, a differential amplifier produces an output signal representative of current flow through the first conductor by sensing the voltage difference between the first and second connections to the first conductor. Temperature-induced changes in the resistance of the first conductor are compensated by a thermistor. The output signal is used to drive one or more displays of amperes, ampere-hours or watt-hours.

13 Claims, 7 Drawing Figures

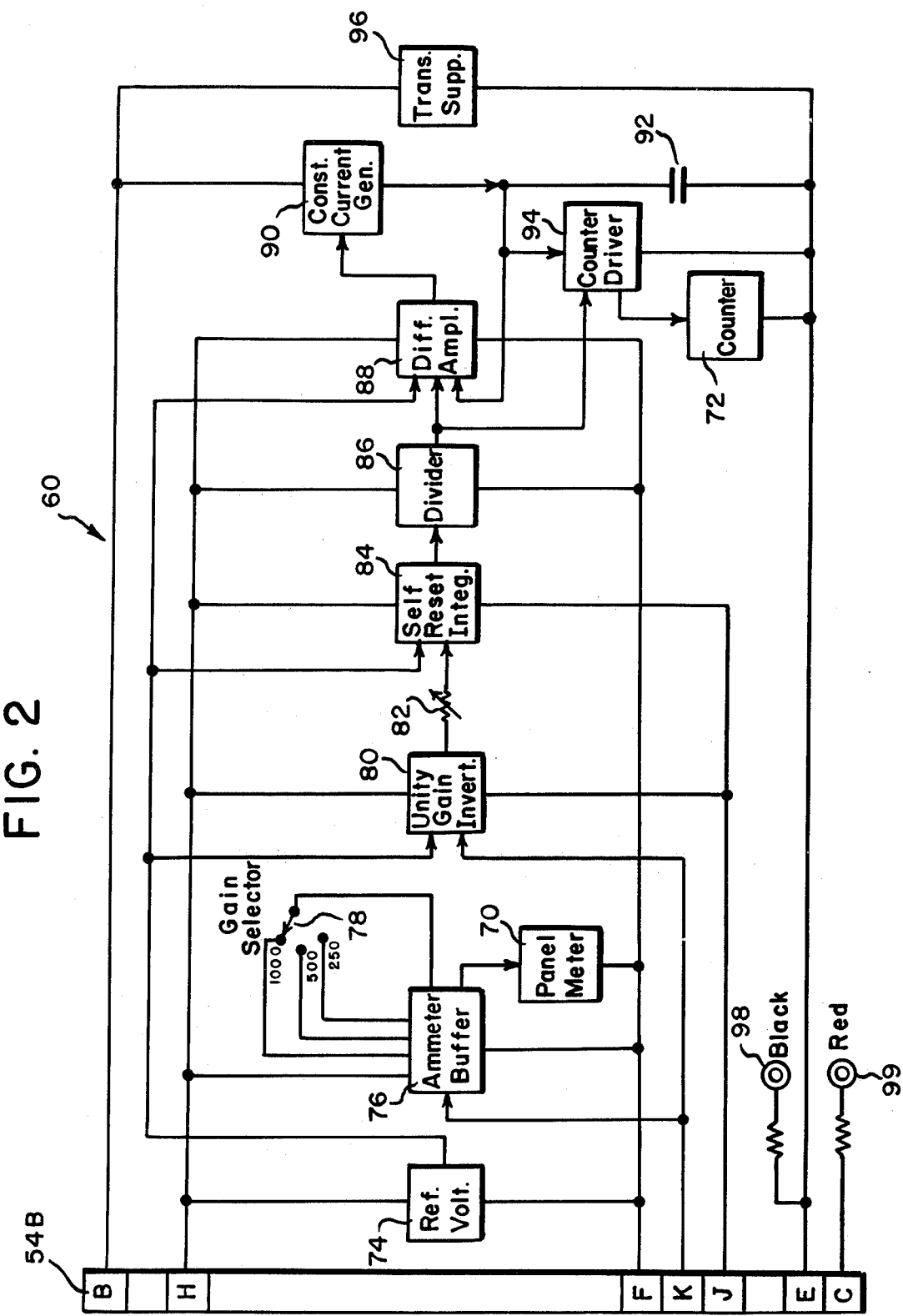

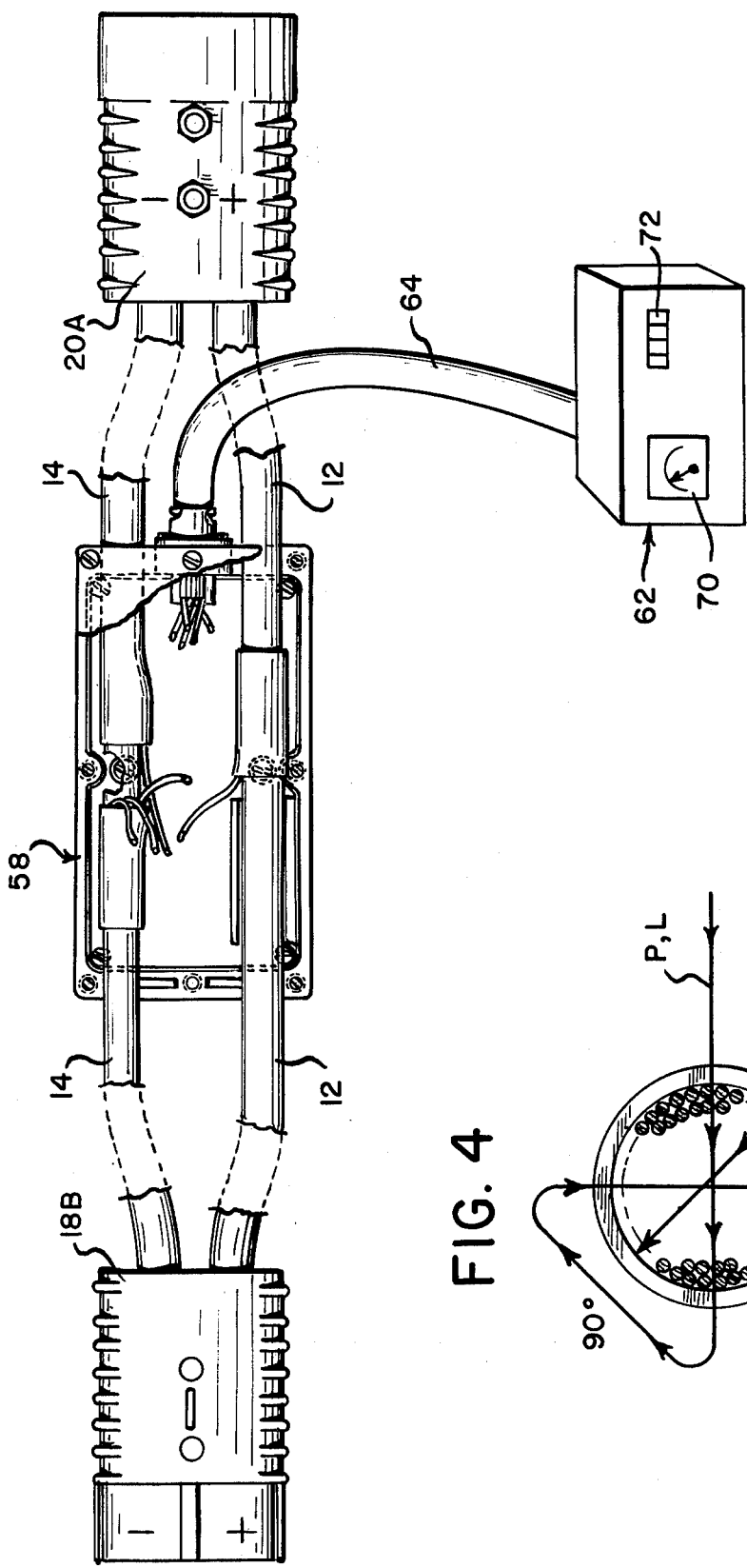

METHOD AND APPARATUS FOR MEASURING CURRENT, ESPECIALLY USEFUL IN MULTI-AMPERE SYSTEMS

BACKGROUND AND SUMMARY OF THE INVENTION

Current sensing schemes for accurate high current measurement are invariably bulky, expensive and/or power consuming. Shunts, magnetic amplifiers and Hall-effect transducers are commonly used despite concessions which must be made in each case. Shunts are bulky, concentrated heat sources that must be installed by breaking the power line. Magnetic amplifiers are expensive and generally require several watts of power for operation. Hall-effect transducers require by-pass currents on the order of 0.1 to 0.5 amperes and typically 2 to 10 watts total power.

To avoid these deficiencies, I have devised a method and apparatus for measuring current flow by taking voltage measurements on the conductor itself. In the preferred embodiment electrical leads are woven into an existing power cable at two spaced-apart points on the cable. Another lead is woven into the other power cable to provide power to the current measuring apparatus. A differential amplifier senses the voltage difference between the electrical leads from the two spaced-apart points and produces an output voltage signal representative of the current in the first cable. To correct for temperature-induced resistivity changes, at least one temperature dependent element is attached to the first cable at a point which has a temperature approximately the same as that between the two electrical connections thereto.

BRIEF DESCRIPTION OF THE DRAWING

These and other elements, objects and features of my invention will be more readily apparent from the following detailed description of the invention in which:

FIG. 2 is a schematic illustration in block diagram form of an illustrative embodiment of display circuitry of my invention;

FIG. 3 is a schematic illustration of the embodiments of FIGS. 1 and 2 as they are connected in a typical cable harness between a battery and a battery powered device;

FIG. 4 is a cross-sectional view of a typical cable depicting one feature of the connection of current sensing circuitry thereto;

DETAILED DESCRIPTION OF THE INVENTION

Figure 1:
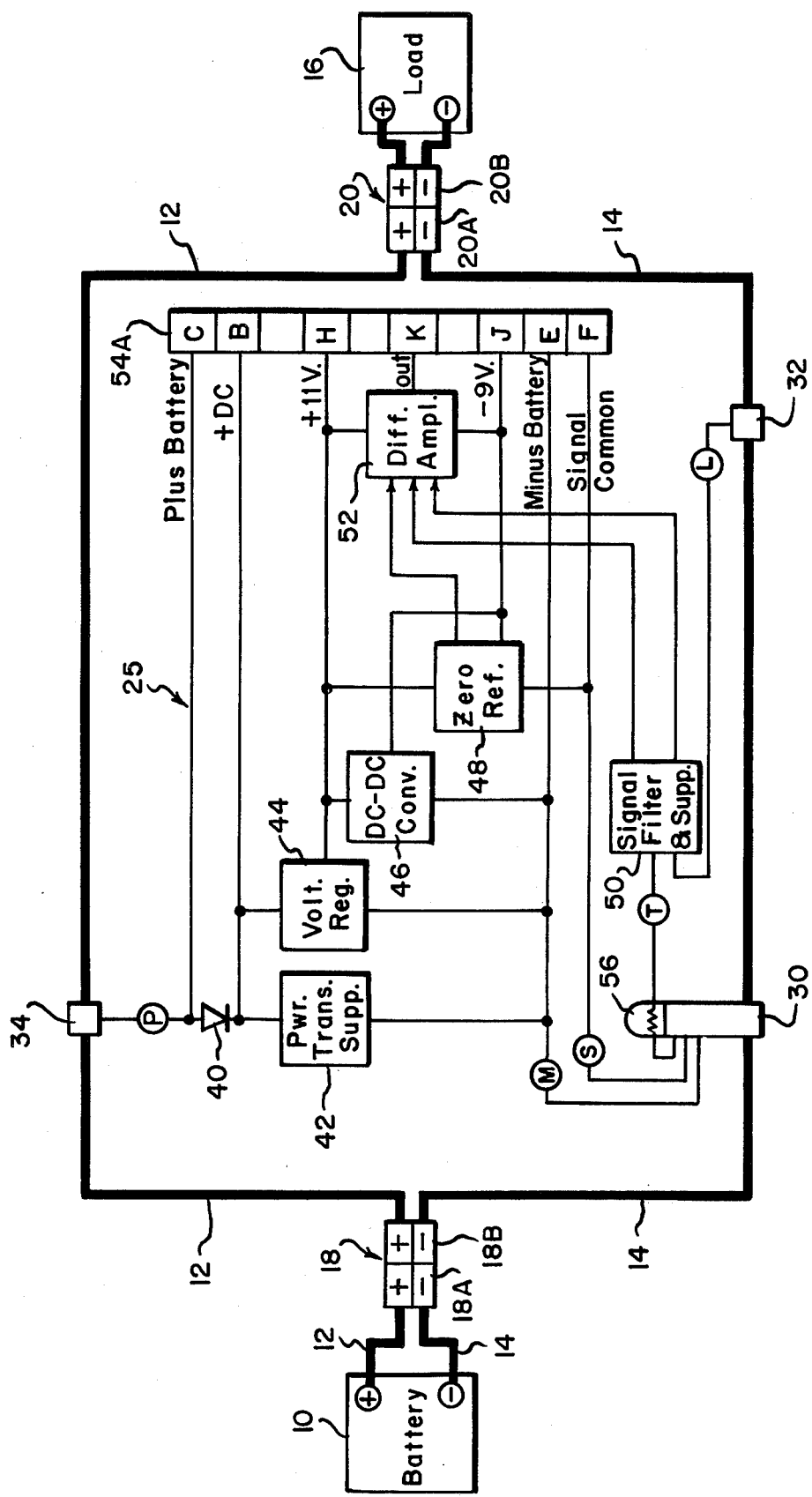
FIG. 1 is a schematic illustration in block diagram form of an illustrative embodiment of current sensing circuitry of my invention.

In the illustrative embodiment shown in the drawing my invention is used to measure current flow from a battery 10 through positive and negative conductors 12 and 14 to a load 16. To permit easy replacement of the battery, a power connector 18 is located in conductors 12 and 14 adjacent the battery. A similar power connector 20 is located in the conductors adjacent load 16.

Battery 10 may be one or more conventional storage batteries such as those of the lead acid type commonly used in numerous industrial applications. Load 16 typically is a drive motor which draws a multi-ampere current in normal situations and even more during start up. A typical application of my invention is in measuring current flow from the battery used to drive a fork lift truck. For this application current flow might be 200 amps while the truck is moving a load on level ground, 800 amps when liting a load and 1,000 amps during start up.

Suitable power connectors for such current flow are readily available. Such connectors comprise a pair of mating units 18A, 18B and 20A, 20B which are designed to fit together in only one way so that the positive conductors can only be connected to each other.

In accordance wih my invention, a sensing circuit 25 is connected to conductors 12, 14 to sense current flow from battery 10 to load 16. Three connections are made to the conductors between half connectors 18B and 20A to form terminals 30 and 32 in the negative conductor 14 and a terminal 34 in positive conductor 12. To these terminals are connected leads L, M, P, S and T as shown in FIG. 1; and between these leads are connected a rectifier 40, a power transient suppressor 42, a voltage regulator 44, a DC—DC convertor 46, a zeroing network 48, a signal filter and transient suppressor 50, a differential amplifier 52, a signal connector 54A and a thermistor 56.

Circuit 25 produces at terminal K of signal connector 54A an output voltage signal which is proportional to the current flow through negative conductor 14. This output signal is applied to a display circuit 60 shown in FIG. 2 to generate a display of amperes and ampere-hours. To produce this output signal, signals are applied on leads T and L from terminals 30 and 32 through signal filter and transient suppressor 50 to differential amplifier 52. Power for the differential amplifier is derived from terminals 30 and 34 which are connected by leads M and P to voltage regulator 44. Regulator 44 produces a positive power supply voltage of plus 11 volts and voltage level convertor 46 produces a negative power supply voltage of minus 9 volts. Power transients are suppressed by suppressor 42 and protection against reverse polarity is provided by rectifier 40.

To compensate for temperature-induced changes in the resistance of conductor 14, thermistor 56 is included in lead T from terminal 30 to differential amplifier 52. The thermistor is physically mounted in thermal contact with terminal 32 so that its temperature is approximately the same as that of the portion of the conductor between terminals 30 and 32. The temperature coefficient of the thermistor is selected to compensate for the temperature-induced change in resistance of conductor 14 between terminals 30 and 32.

In addition to the output signal voltage available at terminal K of connector 54A, the following voltages are available at the terminals indicated: positive battery terminal voltage at terminal C, a positive DC voltage at terminal B, plus 11 volts at terminal H, minus 9 volts at terminal J, negative battery terminal voltage at terminal E, and signal common at terminal F.

The circuit shown between conductors 12, 14 of FIG. 1 is conveniently mounted inside a casing 58 shown in FIG. 3 which is fastened to conductors 12 and 14 between half connector 18B and half connector 20A. Conveniently, terminals 30 and 34 in conductors 12 and 14 are located within casing 58. Terminal 32, which illustratively is 24 inches from terminal 30, is necessarily located beyond casing 58 since the casing itself need not be very large.

In the preferred embodiment of the invention, conductors 12 and 14 are made of multiple-strand twisted cable and terminals 30, 32 and 34 are formed in these cables without cutting them. The insulation on the cable is simply stripped off at the point where the terminal is to be located, the cable is untwisted and a bare wire is threaded through the untwisted cable one or more times. Advantageously, the bare wire is threaded through the untwisted cable in the pattern shown in FIG. 4 which depicts a cross-section of one of conductors 12, 14 and one of leads P, L. In the case of terminal 30, from which there are three leads, three bare wires are first twisted together and are then inserted between the untwisted strands of conductor 14 in the same fashion as leads P and L. Once the bare wires of the terminal have been threaded through the untwisted strands, a bushing is placed around the cable strands, closed tight and then crimped. In the case of terminal 30, thermistor 56 is then connected to one of the three leads and cemented to the bushing so that it is in thermal contact with the cable. Finally, each of the terminals is covered with shrink tubing. In the case of terminal 32, which is located outside casing 58, the lead L from this terminal to the circuitry mounted inside casing 58 is also covered with shrink tubing for protection.

In the preferred embodiment of my invention, the output signals from circuit 25 are applied to a display circuit 60 shown in FIG. 2 to generate a display of the amperes and ampere-hours flowing from battery 10 to load 16. Advantageously, display circuit 60 is enclosed within a display unit 62 as shown in FIG. 3 on which are mounted a meter 70 and a counter 72. Preferably, this display unit is mounted in front of the operator of the apparatus powered by battery 10; and circuits 25 and 60 are connected together by a connector cable 64 of suitable length.

Because connectors 18, 20 are in general use in many industries, my invention can readily be installed simply by opening the power connectors 18 and 20 adjacent the battery and the load and replacing the conductors and connectors therebetween with a preassembled unit comprising half connector 18B, half connector 20A and the conductors and circuitry therebetween as shown in FIG. 3. Display unit 62 can then be mounted in view of the operator and connected by cable 64 to circuit 25 in casing 58.

Returning to FIG. 2, circuit 60 further comprises a signal connector 54B to which are applied the output signals from signal connector 54A in circuit 25. The circuit also comprises a reference voltage source 74, an ammeter buffer 76, a gain selector switch 78, a unity gain inverter 80, a variable resistance 82, a self-resetting integrator 84, a divider circuit 86, a differential amplifier 88, a constant current generator 90, a capacitor 92, a counter driver 94, a transient suppressor 96 and signal jacks 98, 99.

The output signal on line K from circuit 25 is applied to ammeter buffer 76 and unity gain inverter 80 of circuit 60. Gain selector switch 78 connected to buffer 76 is used to select full scale readings of 250 amps, 500 amps or 1,000 amps in accordance with the expected current flow from battery 10 to load 16 of FIG. 1. The actual current flow is displayed on meter 70.

Reference voltage source 74 provides reference voltages to inverter 80, integrator 84 and differential amplifier 88. One input to inverter 80 is adjusted to remove all zero offset in the integration channel. The other input is the output signal from differential amplifier 52 of FIG. 1. The output of inverter 80 is integrated by integrator 84. The rate of integration can be calibrated by adjustment of variable resistance 82. Every time the integral stored by integrator 84 reaches a predetermined level, an output signal is produced which is applied to divider circuit 86. This circuit illustratively is a decade counter which produces one output signal for every ten input signals. The output of divider circuit 86 is applied to counter driver 94 to increment counter 72 by a count of one. Illustratively, the integration interval is selected so that the counter displays 0.1 amperes-hour per count.

The output of amplifier 88 controls the charging of capacitor 92 by constant current generator 90 to provide the energy required to drive counter 72. Charging of capacitor 92 takes place whenever the voltage across the capacitor is less than a predetermined level and there is no output from divider circuit 86. A transient suppressor 96 protects the constant current generator from damage due to voltage transients.

Figure 5:
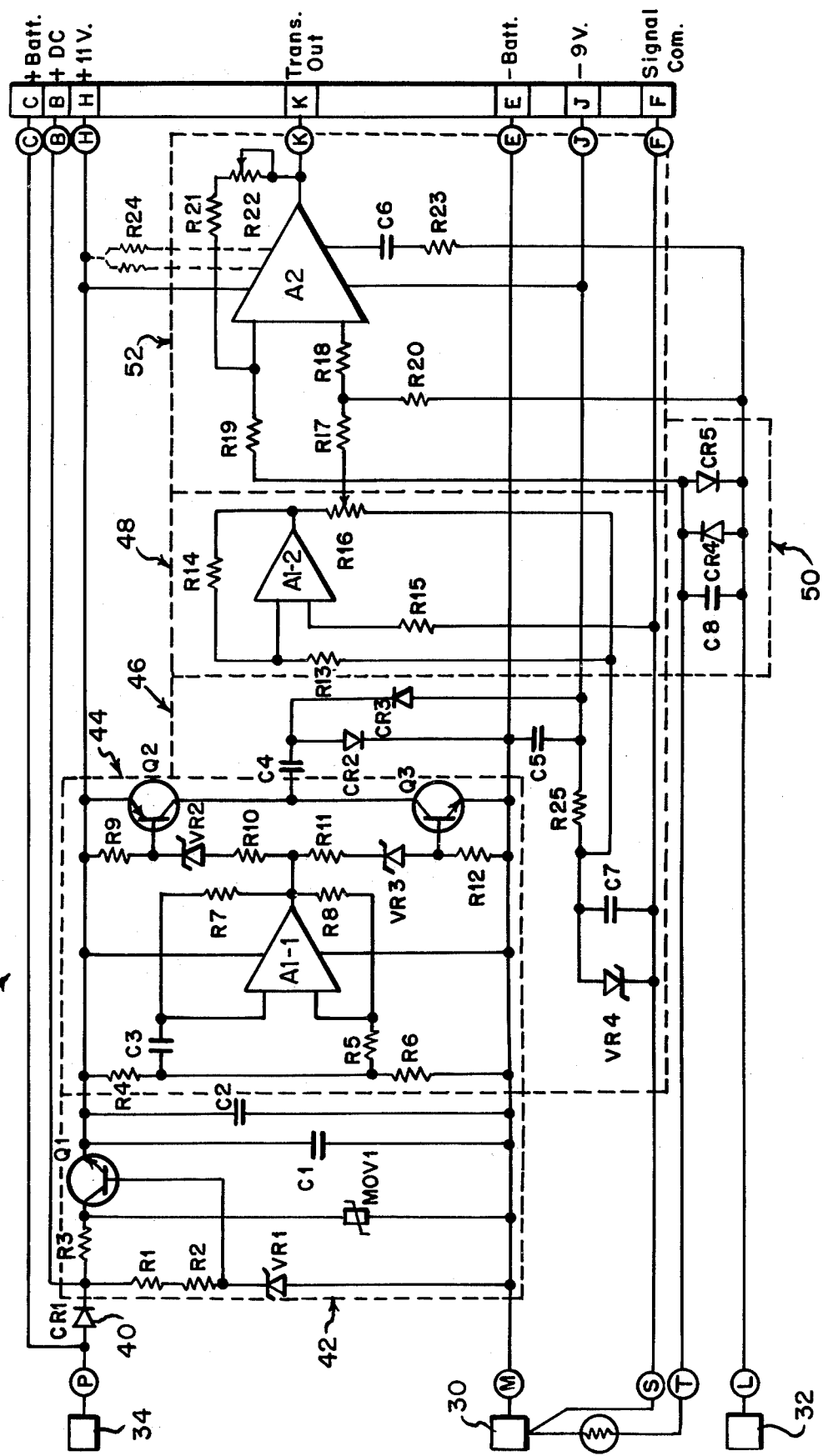
FIG. 5 is a detailed schematic of the embodiment of FIG. 1.
Figure 6A:
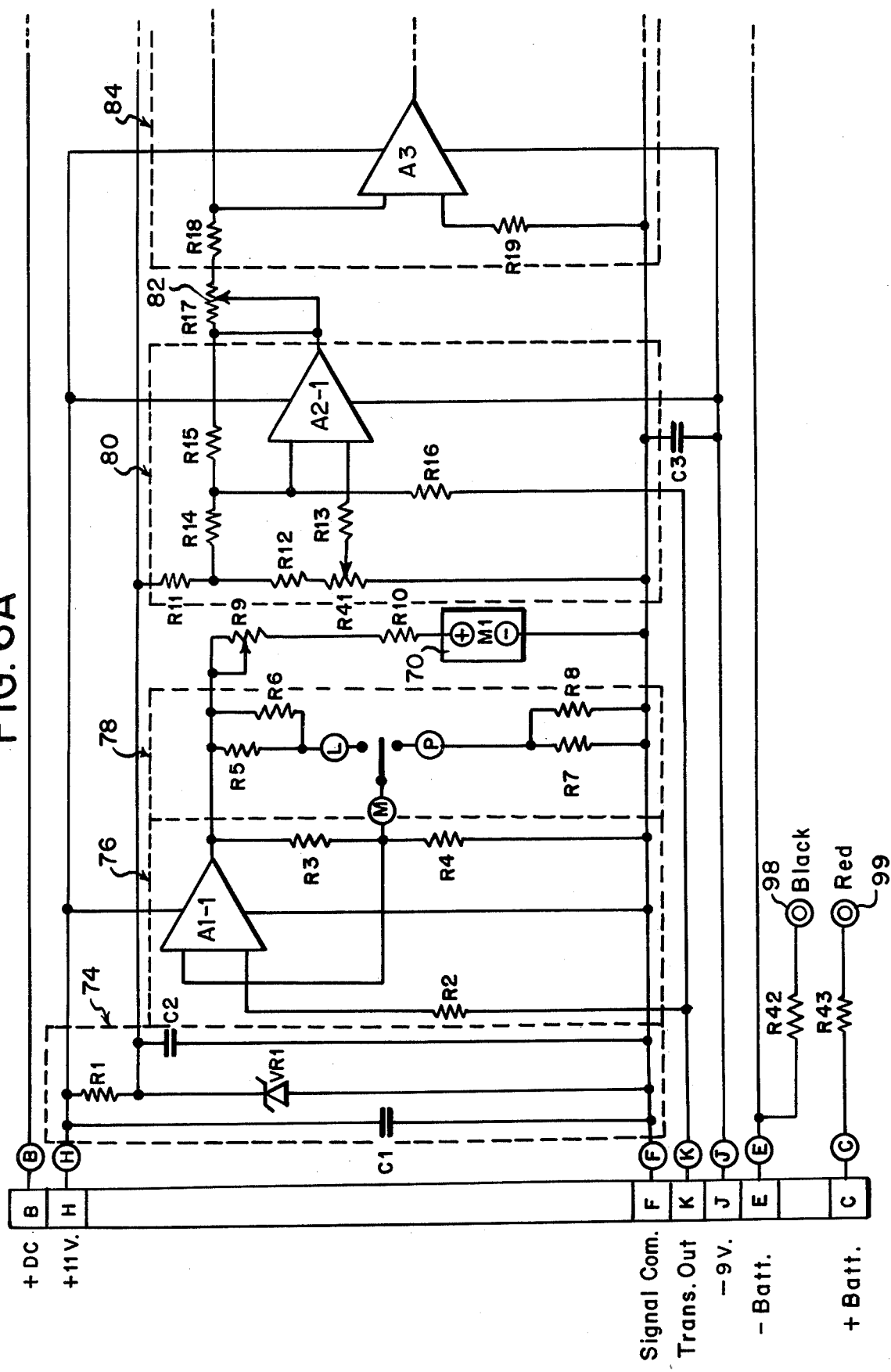
FIGS. 6A and 6B are a detailed schematic of the embodiment of FIG. 2.
Figure 6B:
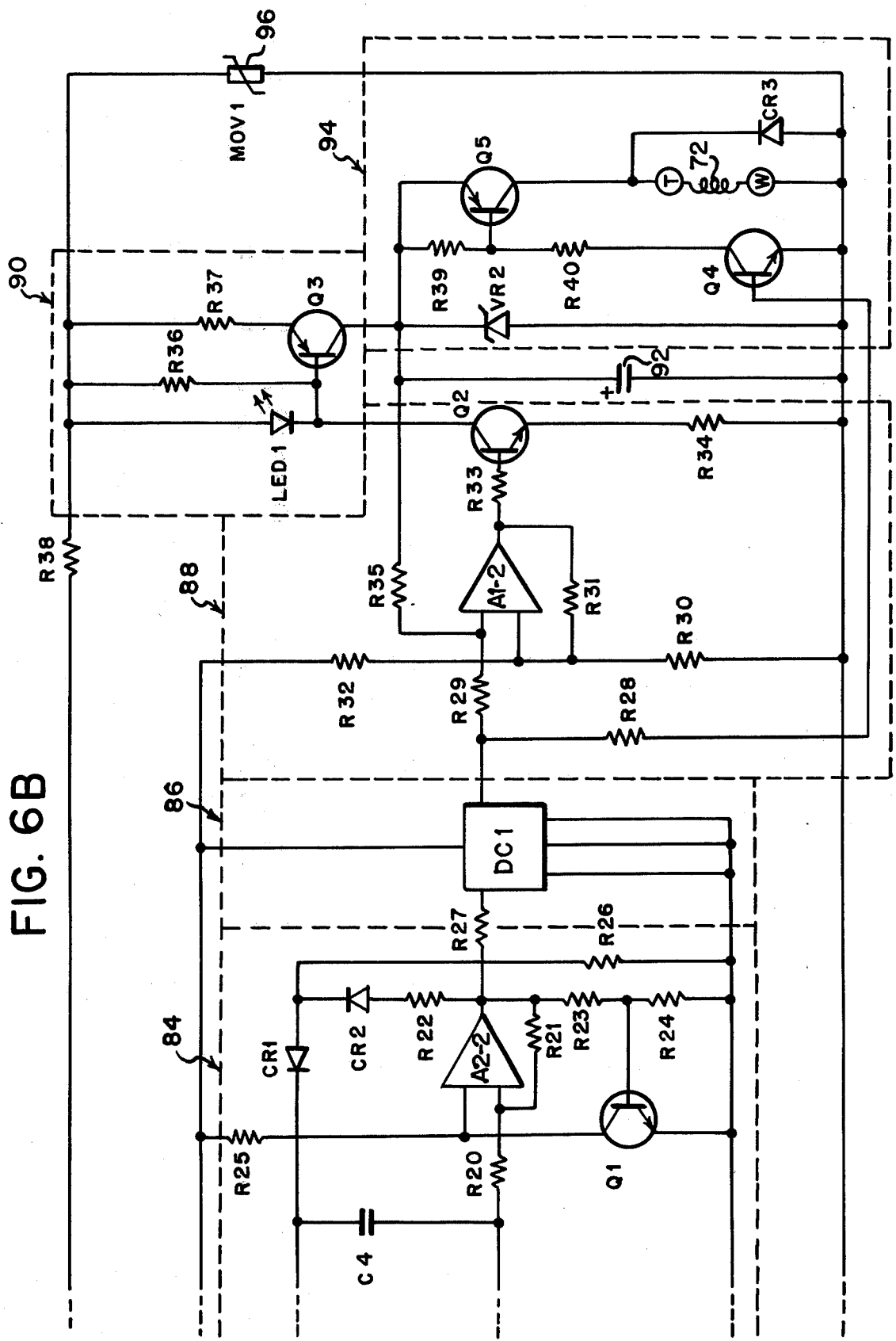

From the foregoing description it will be apparent to one skilled in the art how to implement my invention in any one of numerous specific embodiments. The details of a preferred embodiment are set forth in FIGS. 5 and 6A and 6B which illustrate a sensing circuit 125 and a display circuit 160 that perform the same functions as sensing circuit 25 and display circuit 60. For convenience like elements in FIGS. 1 and 5 and FIGS. 2 and 6 bear the same number. In FIGS. 5 and 6 the approximate location of the apparatus which performs the functions shown in block diagram form in FIGS. 1 and 2 is depicted by dotted lines bearing the number of the corresponding block from FIGS. 1 and 2.

The values of the resistors, capacitors and Zener diode voltages used in FIGS. 5 and 6A and 6B are set forth in Tables I and II, respectively.

TABLE I

| | |
|---|---|
| R1, R2 | 2K ohms |
| R3 | 200 ohms |
| R4, R6, R22 | 10K ohms |
| R5, R7, R8, R13, R14, R16 | 100K ohms |
| R9, R12 | 22K ohms |
| R10, R11 | 1.8K ohms |
| R15 | 47K ohms |
| R17 | 1M ohms |
| R18 | 1.5K ohms |
| R19 | 909 ohms |
| R20 | 100 ohms |
| R21 | 40.2K ohms |
| R23 | 47 ohms |
| R25 | 3.9K ohms |
| C1 | 100uFarads |
| C2, C4, C5, C7, C8 | 15uFarads |
| C3 | 1nFarads |
| C6 | 10nFarads |
| VR1 | 12 volts |
| VR2, VR3 | 5 volts |
| VR4 | 5.6 volts |

TABLE II

| | | |
|---|---|---|
| R1, R22 | | 2.7K ohms |
| R2, R13, R20, R24, R25, R33, R39 | | 10K ohms |
| R3 | | 40.2K ohms |
| R4, R5 | | 16.9K ohms |
| R6, R8 | | Trim |
| R7 | | 12.4K ohms |
| R9, R41 | maximum | 1K ohms |
| R10 | | 8.06K ohms |
| R1 | | 200K ohms |

TABLE II-continued

| | | |
|---|---|---|
| R12, R26, R28, R29, R30 | | 47K ohms |
| R14 | | 1M ohms |
| R15, R16 | | 20K ohms |
| R17 | maximum | 100K ohms |
| R18 | | 221K ohms |
| R19 | | 300K ohms |
| R21 | | 1.5M ohms |
| R23, R36 | | 15K ohms |
| R27 | | 100K ohms |
| R31 | | 6.8M ohms |
| R32 | | 82K ohms |
| R34, R40 | | 2.2K ohms |
| R35 | | 330K ohms |
| R37 | | 22 ohms |
| R38 | | 200 ohms |
| R42, R43 | | 5.1K ohms |
| C1, C2, C3 | | 15uFarads |
| C4 | | 100nFarads |
| Capacitor 92 | | 500uFarads |
| VR1 | | 5.6 volts |
| VR2 | | 24 volts |

In FIG. 5, amplifier A2 is a 725-type high performance differential amplifier. R24 is a zeroing resistor which is connected either to terminal 1 or terminal 8. The value of resistor 24 is selected to zero the amplifier. The closed loop gain of amplifier A2 at DC and low frequencies is governed by thermistor 56 and resistors R19, R21 and R22. Thermistor 56 is a 680 ohm silicon resistor (at 25 degrees Celsius) with a positive temperature coefficient. Resistor R19 has substantially no change in resistance over the operating temperature range to which it is exposed. The resistance value of thermistor 56 and its temperature coefficient are selected so that the percentage change in resistance of the series combination of thermistor 56 and resistor R19 is approximately the same as the percentage change in resistance in conductor 14 between terminals 30 and 32 throughout its operating temperature range.

Variable resistor R22 is adjusted to produce a transfer function at terminal K of 5 millivolts per ampere. Illustratively, conductors 12, 14 are 0 gauge multi-strand copper cable and the distance between terminals 30 and 32 is twenty-four inches. For these conditions the resistance in conductor 14 between these two terminals is approximately 163 microohms at 25° C. Since the gain of amplifier A2 is determined by the ratio of the resistance in the feedback loop to the resistance in the lead to the inverting input of the amplifier, the nominal resistance of variable resistance R22 can readily be determined to be 8.53K ohms from the following equation:

$$\frac{5 \text{ mvolts/amp}}{.163 \text{ mvolts/amp}} = \frac{R21 + R22}{680 \text{ ohms} + R19}$$

If other gauges of copper cable or different distances between terminals 30 and 32 are used so that the resistance between these terminals is not 163 microohms, the gain of amplifier A2 can be modified to produce a 5 mvolts/amp output by adjusting variable resistance R22.

Circuit element A1-1 is a portion of an NE532-type operational amplifier used as an oscillator to drive push-pull transistors Q2 and Q3. The coupling network between this oscillator and the transistors guarantees no switching overlap. The output from these transistors is rectified and filtered to produce the negative voltage supply to differential amplifier A2.

Zener diode VR4 and unity gain inverter A1-2 provide a stable temperature-tracking voltage reference for a precision zeroing network comprising resistors R16, R17, R18 and R20. Inverter A1-2 is a sub-section of the NE532-type op amp. Elements C6, C8 and R23 are frequency compensation elements.

In FIG. 6A, circuit element A1-1 is a portion of an NE532-type op amp used here as a scaling amplifier with three gain settings for ammeter indications of 250, 500 and 1000 amperes full scale. Circuit element 70 is an ammeter which is calibrated by variable resistor R9. Trimming resistors R6 and R8 are used to calibrate the 250 and 1000 ampere settings.

Circuit element A2-1 is a second NE532-type op amp used as a unity gain inverting amplifier having one input which is zeroed by adjustment of variable resistor R41. The other input is the output signal on lead K from sensing circuit 125.

The output of this amplifier is applied to circuit element A3 which is a 355-type FET integrator using a polycarbonate integrating capacitor C4. Circuit element A2-2 of FIG. 6B is a sub-section of the second NE532-type op amp used as a threshold detector which is triggered when the output of the FET integrator exceeds a +5.6 volt reference level. The trigger signal is applied to a decade counter 86. The trigger signal also causes integrator A3 to be reset.

Decade counter 86 is a conventional counter such as a CMOS 4017 having a one out of ten decoded output. At every tenth count, electro-mechanical counter 72 is advanced one count. The energy required to drive the counter is derived from capacitor 92. This capacitor is charged by the constant current generator 90 whenever transistor Q2 is conducting. Circuit element A1-2 is a sub-section of the first NE532 op amp used as a threshold detector to cause transistor Q2 to conduct whenever the voltage across capacitor 92 is less than 16 volts and the output from decade counter DC1 is not high.

The constant current generator is protected from voltage transients by resistor R38 and metal oxide varistor MOV1.

Jacks 98, 99 are available to permit connection of a voltmeter to the display circuit whenever voltage measurements are desired. Resistors R42 and R43 protect cicuits 125, 160 from damage due to any inadvertent short circuit that might exist in the voltmeter.

If desired, a display of watt-hours can also be generated using the signals on leads C and E which are battery terminal voltage as well as the output signal on lead K which represents battery current. A signal representative of watts can be formed simply by multiplying the battery voltage by battery current in a conventional multiplying circuit. Such a signal can then be integrated to produce an output representative of watt-hours. The details of such circuitry will be apparent to those skilled in the art in light of my teaching on display circuit 160.

From the foregoing it will be apparent that numerous variations may be made in my invention without departing from the spirit and scope thereof. While the circuit shown is designed to measure currents of hundreds of amperes, similar circuits can readily be devised from my teaching for the measurement of any size current. Of course, the accuracy of such measurements would depend on the power requirements of the current sensing and display circuits. For the circuits shown in FIGS. 5 and 6 approximately 0.1 to 0.2 watts are needed, considerably less than the 2 to 10 watts power requirements of typical magnetic amplifier or Hall-effect circuits.

Numerous modifications may be made in the specific circuit elements disclosed. For example, other gauges and other types and/or materials may be used for conductors 12, 14. If the temperature coefficient of such conductors is the same as that of conductor 14, any difference in resistance in such conductor may be compensated for simply by adjusting the gain of amplifier 52. If the temperature coefficient is different, a different thermistor should be selected having a resistance and a temperature coefficient such that the resistance in the lead from terminal 30 to the inverting input of amplifier 52 changes with temperature the same percentage as the resistance in the conductor between terminals 30 and 32.

The 680 ohm thermistor shown in FIG. 5 tracks resistance change in conductor 14 quite well between about 0 degrees Celsius and about 70 degrees Celsius. For other temperature ranges, thermistors with other resistances and/or temperature coefficients may prove to track resistance changes more closely. Selection of such devices can readily be made using published information and empirical testing.

Numerous other changes may readily be devised by one skilled in the art. For example, with suitable modifications in circuit 25, terminals 30 and 32 could be located in the positive conductor and terminal 34 in the negative conductor. While the invention is most easily installed in apparatus in which mating connectors 18, 20 are already provided, my invention may also be practiced without such connectors.

What is claimed is:

1. Apparatus for measuring current flow through a pair of electrical conductors which connect a load to a pair of terminals of an electrical power source, said apparatus comprising:
   first and second electrical leads connected to a first conductor in said pair at spaced apart points on said conductor;
   a third lead connected to a second conductor in said pair;
   temperature compensating means mounted on said first conductor at a point such that said means is at approximately the same temperature as that portion of the conductor between said first and second leads;
   means for producing in response to signal inputs thereto an electrical output signal representative of the current flow through said first conductor;
   first means for connecting said first and second leads and said temperature compensating means to said output signal producing means to provide signal inputs thereto, said temperature compensating means being connected so as to substantially offset temperature induced changes in the resistance of the first conductor between the points of connection of said first and second leads; and
   second means for connecting said third lead and at least one of said first and second leads to said output signal producing means to provide power thereto.

2. The apparatus of claim 1 wherein the output signal producing means is a differential amplifier and the second connecting means comprises means for producing power supply voltages for said differential amplifier.

3. The apparatus of claim 2 wherein the temperature compensating means is a thermistor which is connected in series between said first lead and an input to the differential amplifier and said second lead is connected to a second input to said differential amplifier.

4. The apparatus of claim 1 further comprising means for displaying at least one of amperes and ampere-hours, said means being driven by said electrical output signal.

5. The apparatus of claim 4 further comprising means for providing power from said first and second conductors to said display means.

6. The apparatus of claim 1 wherein said first and second conductors are made of multiple-strand twisted cable and each of said first, second and third leads are connected to one of said conductors by untwisting the strands of said conductor, threading a bare wire at least once through the untwisted strands of the conductor, placing a bushing around the cable strands and securing it tightly thereto.

7. Apparatus for measuring current flow through a pair of electrical conductors which connect a load through first and second mating connecting means to a pair of terminals of an electrical power source, said mating connecting means permitting ready disconnection of the power source by separation of said first and second mating connecting means, said apparatus comprising:
   first and second electrical conductors;
   first means for connecting one end of said electrical conductors to said first mating connecting means;
   second means for connecting the other end of said electrical conductors to said second mating connecting means;
   first and second electrical leads connected to said first conductor at spaced apart points on said conductor;
   a third lead connected to said second conductor;
   temperature compensating means mounted on said first conductor at a point such that said means is at approximately the same temperature as that portion of the conductor between said first and second leads;
   means for producing in response to signal inputs thereto an electrical output signal representative of the current flow through said first conductor;
   first means for connecting said first and second leads and said temperature compensating means to said output signal producing means to provide signal inputs thereto, said temperature compensating means being connected so as to substantially offset temperature induced changes in the resistance of the first conductor between the points of connection of said first and second leads; and
   second means for connecting said third lead and at least one of said first and second leads to said output signal producing means to provide power thereto.

8. The apparatus of claim 7 wherein the output signal producing means is a differential amplifier and the second connecting means comprises means for producing power supply voltages for said differential amplifier.

9. The apparatus of claim 8 wherein the temperature compensating means is a thermistor which is connected in series between said first lead and an input to the differential amplifier and said second lead is connected to a second input to said differential amplifier.

10. The apparatus of claim 7 further comprising means for displaying at least one of amperes and ampere-hours, said means being driven by said electrical output signal.

11. The apparatus of claim 10 further comprising means for providing power from said first and second conductors to said display means.

12. The apparatus of claim 7 wherein said first and second conductors are made of multiple-strand twisted cable and each of said first, second and third leads are connected to one of said conductors by untwisting the strands of said conductor, threading a bare wire at least once through the untwisted strands of the conductor, placing a bushing around the cable strands and securing it tightly thereto.

13. The apparatus of claim 7 further comprising an enclosure surrounding a portion of said first conductor at the point where one of said first and second leads is connected thereto and a portion of said second conductor at the point where said third lead is connected thereto, said temperature compensating means, said output signal producing means and at least portions of said first and second connecting means being located within said enclosure.

* * * * *